United States Patent [19]

Sugiyama

[11] Patent Number: 5,016,010

[45] Date of Patent: May 14, 1991

[54] SYSTEM FOR CONTROLLING A NUMBER OF BITS REQUIRED TO REPRESENT CODED OUTPUT DATA

[75] Inventor: Kenji Sugiyama, Noda, Japan

[73] Assignee: Victor Company of Japan, Ltd., Japan

[21] Appl. No.: 467,396

[22] Filed: Jan. 22, 1990

[30] Foreign Application Priority Data

Jan. 24, 1989 [JP] Japan .................................. 1-14273

[51] Int. Cl.⁵ .............................................. H03M 7/40
[52] U.S. Cl. ......................................... 341/67; 341/51; 341/61; 375/122
[58] Field of Search ..................... 341/51, 61, 65, 77, 341/67, 76, 95, 107, 143; 358/261.2; 375/122; 381/47

[56] References Cited

U.S. PATENT DOCUMENTS

| | | | |
|---|---|---|---|
| 4,133,976 | 1/1979 | Atal et al. ................................ | 381/47 |
| 4,179,710 | 12/1979 | Ishiguro et al. .................. | 375/122 X |
| 4,375,013 | 2/1983 | Cointot et al. ........................ | 375/122 |
| 4,411,003 | 10/1983 | Su ........................................... | 341/143 X |
| 4,414,536 | 11/1983 | Sumi ....................................... | 341/76 |
| 4,617,676 | 10/1986 | Jayant et al. ..................... | 375/122 X |
| 4,837,571 | 6/1989 | Lutz ..................................... | 341/61 X |

FOREIGN PATENT DOCUMENTS 57-11190  3/1982  Japan .
61-48692  11/1986  Japan .
63-151269  6/1988  Japan .

Primary Examiner—Mark J. Reinhart
Assistant Examiner—Randy W. Gibson
Attorney, Agent, or Firm—Lowe, Price, LeBlanc, Becker & Shur

[57] ABSTRACT

An encoder encodes input data into codes and outputs the codes. The numbers of bits required to represent the codes which are outputted from the encoder during respective first predetermined periods (such as periods for scanning a block of pixels) are predicted. The predicted numbers are added to derive a sum therefore. Such a sum is generated during each of a plurality of second predetermined periods (such as one-frame periods), which are longer than each of the first periods. An actual number of bits required to represent the output codes from the encoder is controlled in accordance with the derived sum. Differences between the predicted numbers of bits representing the output codes and the actual numbers of bits representing the output codes which are generated during the respective first periods are sequentially generated. The differences are accumulated into an accumulated value. The actual number of bits representing the output codes from the encoder is controlled in accordance with the accumulated value. The actual number of bits representing the codes which are outputted from the encoder during each second period can thus be held to be equal to or less than a predetermined number.

2 Claims, 3 Drawing Sheets

SYSTEM FOR CONTROLLING A NUMBER OF BITS REQUIRED TO REPRESENT CODED OUTPUT DATA

BACKGROUND OF THE INVENTION

1. Field of the Invention

This invention relates to a system for controlling a number of bits required to represent coded output data.

2. Description of the Prior Art

A highly efficient encoding system for compressing the number of bits representing particular data is used in various apparatuses such as a communication apparatus, a recording and reproducing apparatus, and a display apparatus. Some of such encoding systems output variable-length codes. Generally, it is desirable that the codes are outputted from an encoding system at essentially a constant rate.

It is known to control the number of bits of coded data output data from such an encoding system. There are two data amount control systems. In the first data amount control system, the amount of coded output data is held approximately constant by use of entropy encoding and feedback control. In the second data amount control system, the amount of coded output data is held essentially constant by use of adaptive control of a quantization bit number and feedforward control. The second data amount control system is disclosed in Japanese published unexamined patent application No. 63-151269.

The first data amount control system can hold the average of the amount of coded output data essentially constant for a long time but can not surely hold the amount of coded output data equal to or within a prescribed amount for each of short unit periods.

In the second data amount control system, since the data amount per signal block is required to be fixed with respect to a quantizing step size, entropy encoding can not be used so that the efficiency of encoding tends to be inadequate.

SUMMARY OF THE INVENTION

It is an object of this invention to provide an improved system for controlling an amount of coded output data.

According to a first aspect of this invention, a system for controlling an amount of coded output data comprises means for encoding input data into codes and outputting said codes; means for predicting amounts of the codes which are outputted from the encoding means during respective first predetermined periods; means for adding the predicted amounts of the output codes to derive a sum of the predicted amounts of the output codes which is generated during each second predetermined period longer than each of the first periods; means for controlling an actual amount of the output codes from the encoding means in accordance with the derived sum; means for sequentially generating differences between the predicted amounts of the output codes and the actual amounts of the output codes which are generated during the respective first periods; means for accumulating said differences into an accumulated value; and means for controlling the actual amount of the output codes from the encoding means in accordance with the accumulated value; whereby the actual amount of the codes which are outputted from the encoding means during each second period can be held equal to or smaller than a predetermined amount.

According to a second aspect of this invention, a system for controlling an amount of coded output data comprises means for encoding input data into codes and outputting said codes; means for predicting a rate of the outputting of the codes from the encoding means; means for controlling an actual rate of the outputting of the codes from the encoding means in accordance with the predicted rate; means for determining a target rate of the outputting of the codes from the encoding means; means for detecting a difference between the actual rate and the target rate of the outputting of the codes from the encoding means; and means for controlling the actual rate of the outputting of the codes from the encoding means in accordance with the detected difference.

DESCRIPTION OF THE PREFERRED EMBODIMENT

In the embodiment of this invention, an encoded object is a video signal. Each frame of the video signal is divided into a plurality of parts called blocks. As will be made clear hereinafter, the video signal is generally processed in block units. The time period spent in scanning a block is thus shorter than the time period corresponding to a frame.

Figure 1:
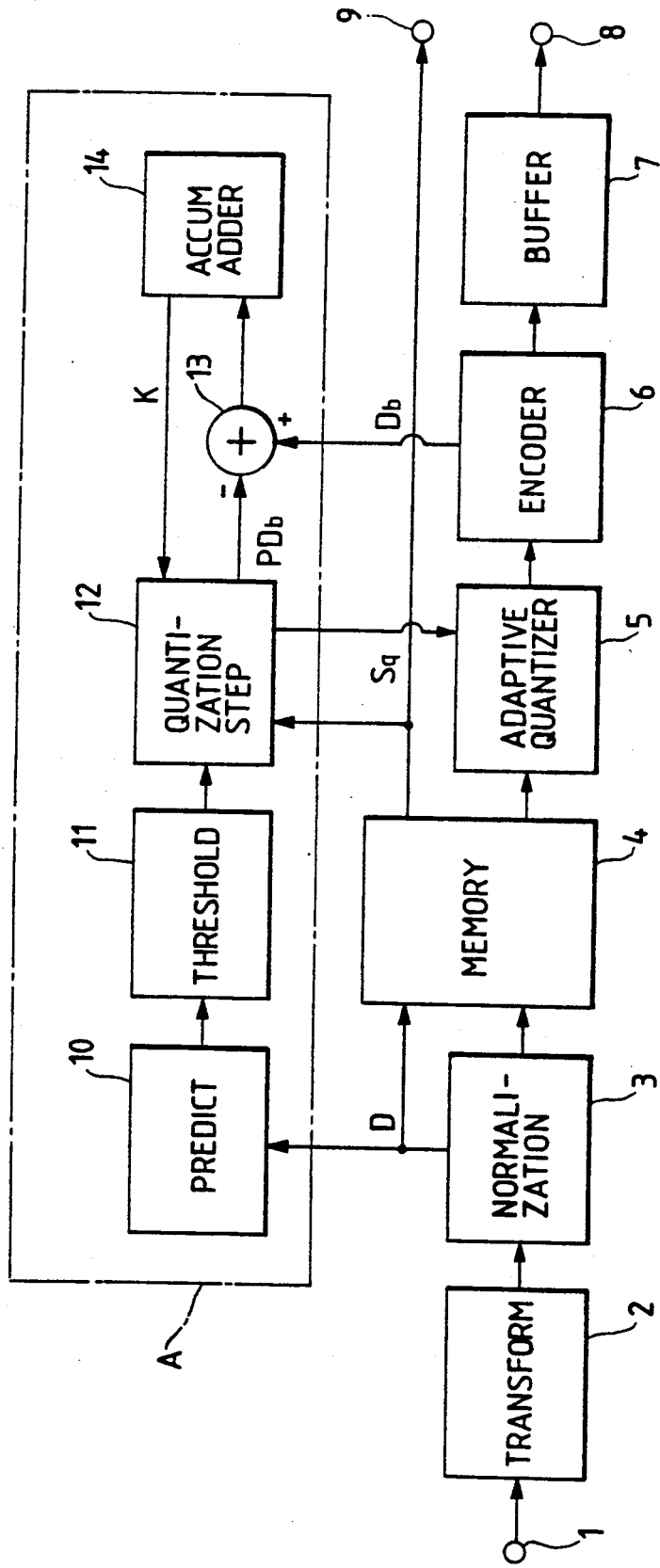
FIG. 1 is a block diagram of a system for controlling an amount of coded output data according to an embodiment of this invention.

With reference to FIG. 1, a video signal is fed via an input terminal 1 to an orthogonal transform device 2. The video data of each of the successive signal blocks is subjected by the orthogonal transform device 2 to orthogonal transforms such as Hadamard transform or discrete cosine transform. The orthogonal transform device 2 outputs a plurality of orthogonal transform coefficients including one average component (a DC coefficient) and alternating components (AC coefficients) for each of successive signal blocks.

The orthogonal transform coefficients outputted from the orthogonal transform device 2 are fed to a normalizing device 3 and are normalized by the normalizing device 3.

Figure 3:
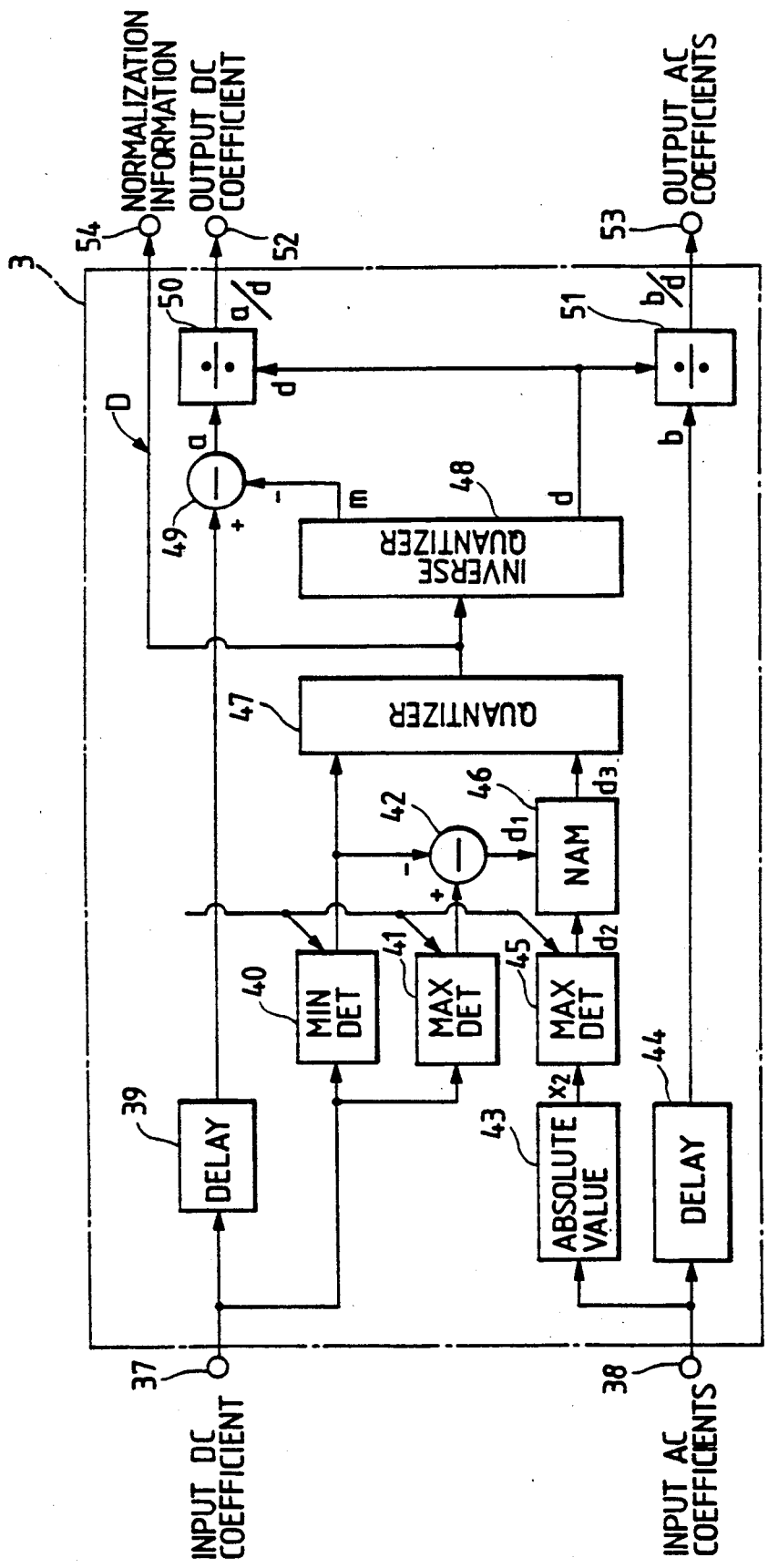
FIG. 3 is a block diagram of the normalizing device in the system of FIG. 1.

FIG. 3 shows the normalizing device 3. As shown in FIG. 3, the normalizing device 3 includes an input terminal 37 for receiving the DC coefficient and an input terminal 38 for receiving the AC coefficients. The normalizing device 3 normalizes the input DC coefficient into a normalized DC coefficient. In addition, the normalizing device 3 normalizes the input AC coefficients into normalized AC coefficients. The normalization of the DC coefficient is separate from the normalization of the AC coefficients. The normalized DC coefficient is outputted via an output terminal 52. The normalized AC coefficients are outputted via an output terminal 53. The normalizing device 3 generates normalization information (data) of representative level values and variation values and outputs the normalization information (data) via an output terminal 54.

The method of the normalization of input DC coefficient and the method of the normalization of input AC coefficients are different from each other. Since the DC coefficient corresponds to an average value within a block, the DC coefficient is normalized by use of maximal and minimal values in a manner similar to that of the normalization of general sample values. Since the average value of the AC coefficients is close to zero, the normalization is performed on the absolute values of the AC coefficients.

The input DC coefficient is fed to a minimal value detector 40 and a maximal value detector 41. A minimal value and a maximal value of the DC coefficients of respective serially-inputted blocks are detected by the detectors 40 and 41 respectively. After the detection of the minimal value and the maximal value, the detectors 40 and 41 are reset by a reset signal for waiting subsequent input sample values.

The detected minimal value and the detected maximal value are fed from the detectors 40 and 41 to a subtracter 42. The subtracter 42 subtracts the minimal value from the maximal value, outputting the difference value d1 between the maximal value and the minimal value.

The input AC coefficients are fed to an absolute value calculator 43. The absolute value calculator 43 calculates the absolute values of the AC coefficients and doubles the calculated absolute values. The doubling of the absolute values is performed in view of the fact that the peak values are approximately halved during the calculation of the absolute values.

The output signal from the absolute value calculator 42 is fed to a maximal value detector 45. The maximal value detector 45 detects a maximal value d2 of the doubled absolute values of the AC coefficients. After the detection of the maximal value, the maximal value detector 45 is reset by the reset signal to wait for subsequent input sample values.

The difference value d1 related to the DC coefficient and also the maximal value d2 related to the AC coefficients represent variation amounts (variation values), so that the values d1 and d2 can be handled in common later. The values d1 and d2 are fed to a non additive mixer (NAM) 46. The NAM 46 selects the greater of the two values d1 and d2 and outputs the selected value as a variation value d3.

The variation value d3 and the minimal value (the representative level value) are fed to a vector quantizer 47 from the NAM 46 and the minimal value detector 40 respectively, and are quantized by the vector quantizer 47 to reduce the amount of information.

The quantized representative level value and the quantized variation value outputted from the vector quantizer 47 represent normalization information D. The representative level value and the variation value are transmitted from the vector quantizer 47 to other circuits and a decoding system (not shown) via the output terminal 54. In addition, the quantized representative level value and the quantized variation value are fed from the vector quantizer 47 to an inverse quantizer 48, and are converted by the inverse quantizer 48 back to a minimal value (a representative level value) m and a variation value d related to the reduced amount of information.

The minimal value m is fed from the inverse quantizer 48 to a subtracter 49. The input DC coefficient is fed via the input terminal 37 to a delay device 39, and is delayed by the delay device 39 by a predetermined time chosen to achieve the following operation. When the normalization of all the coefficients of one signal block is completed, the DC coefficient is applied from the delay device 39 to the subtracter 49. The subtracter 49 subtracts the minimal value m from the DC coefficient, outputting a new DC coefficient a. As a result of this operation, the minimum value of the new DC coefficient a is made equal to zero, and the range of the level of the DC coefficient is shifted so that the amount of information is reduced.

The new DC coefficient a is fed from the subtracter 49 to a divider 50. The variation value d is fed from the inverse quantizer 48 to the divider 50. The divider 50 divides the new DC coefficient a by the variation value d, normalizing the DC coefficient and generating a normalized DC coefficient which resides in the range between 0 and 1. The normalized DC coefficient outputted from the divider 50 is transmitted via the output terminal 52.

The variation value d is fed from the inverse quantizer 48 to a divider 51. The input AC coefficients are fed via the input terminal 38 to a delay device 44, and are delayed by the delay device 44 by a predetermined time chosen to achieve the following operation. When the normalization of all the coefficients of one signal block is completed, the AC coefficients are applied from the delay device 44 to the divider 51 as delayed AC coefficients b. The divider 51 divides the AC coefficients b by the variation value d, normalizing the AC coefficients and generating normalized AC coefficients which reside in the range between 0 and 1. The normalized AC coefficients outputted from the divider 51 are transmitted via the output terminal 53.

Returning to FIG. 1, the output signals from the normalizing device 3 are delayed by a fixed-length memory 4 by a predetermined time designed so as to compensate for a time lag which would be caused by feedforward control. The delayed signals of the AC and DC coefficients are fed from the fixed-length memory 4 to an adaptive quantizer 5. The adaptive quantizer 5 quantizes the AC and DC coefficients with a variable quantizing step size Sq which is determined for each of the signal blocks.

The output data from the adaptive quantizer 5 is encoded by an entropy encoder 6 into variable-length codes such as Huffman codes. The number of bits representing the code data from the entropy encoder 6 is small when a large quantizing step size Sq is used in the adaptive quantizer 5. On the other hand, the number of bits representing the code data from the entropy encoder 6 is large when a small quantizing step size Sq is used in the adaptive quantizer 5. In this way, the amount of the output code data from the entropy encoder 6 depends on the quantizing step size Sq used in the adaptive quantizer 5. The output code data from the entropy encoder 6 is temporarily stored in a variable-length buffer memory 7. The code data is read out from the variable-length buffer memory 7 and is transmitted via an output terminal 8 at a predetermined fixed transmission rate.

In the case where Huffman codes are used, the data of the level "0" corresponds to the shortest code word and the data of a greater absolute level corresponds to a longer code word. Since most of the AC orthogonal transform coefficients reside around "0", most of the data is encoded by the entropy encoder 6 into short code words. Therefore, the encoding by the entropy encoder 6 enables a significant compression of the data.

The normalization information signal D outputted from the normalizing device 3 is delayed by the fixed-length memory 4. The normalization information signal is read out from the fixed-length memory 4 and is transmitted via an output terminal 9. Since the normalization information data has a fixed word length, it is unnecessary to provide a buffer memory for the normalization information data.

As described previously, the amount of the output code data from the entropy encoder 6 depends on the quantizing step size Sq used in the adaptive quantizer 5. A control section A controls the amount of the output code data from the entropy encoder 6 by adjusting the quantizing step size Sq used in the adaptive quantizer 5. This control is designed so as to maintain the amount of the output code data per preset period such as one-frame period at approximately a predetermined constant amount. The control section A determines the quantizing step size Sq in accordance with the non-delayed normalization information fed from the normalizing device 3, the delayed normalization information fed from the fixed-length memory 4, and a signal fed from the entropy encoder 6 which represents the actual amount Db of output code data.

The structure and operation of the control section A will be further described with reference to FIG. 1 and FIG. 2. The control section A includes a data prediction device 10 and a quantization step setting device 12. The data prediction device 10 is fed with the non-delayed normalization information from the normalizing device 3. The quantization step setting device 12 is fed with the delayed normalization information from the fixed-length memory 4. The control section A executes feed-forward control in response to the non-delayed normalization information and the delayed normalization information.

The data prediction device 10 includes a ROM holding prediction values for the number of bits required to represent the coded data thereof, per block which are predetermined as a function of normalization information. As described previously, the data prediction device 10 receives the signal D representative of the normalization information from the normalizing device 3. The data prediction device 10 determines a prediction value for the number of bits in accordance with the received normalization information by using the normalization information signal D as an address signal to the ROM and by reading the prediction value from the ROM location which is denoted by the address signal. Since the prediction values for the data amount are preferably varied with the degree of the roughness or the fineness of the quantization, it is preferable that these prediction values are chosen so as to correspond to the quantizing step sizes used in the adaptive quantizer 5. The determined prediction value is outputted from the data prediction device 10 to a threshold value setting device 11. The threshold value setting device 11 sets a threshold value in accordance with the prediction value fed from the data prediction device 10. The threshold value is fed from the threshold setting device 11 to a quantization step setting device 12.

Figure 2:
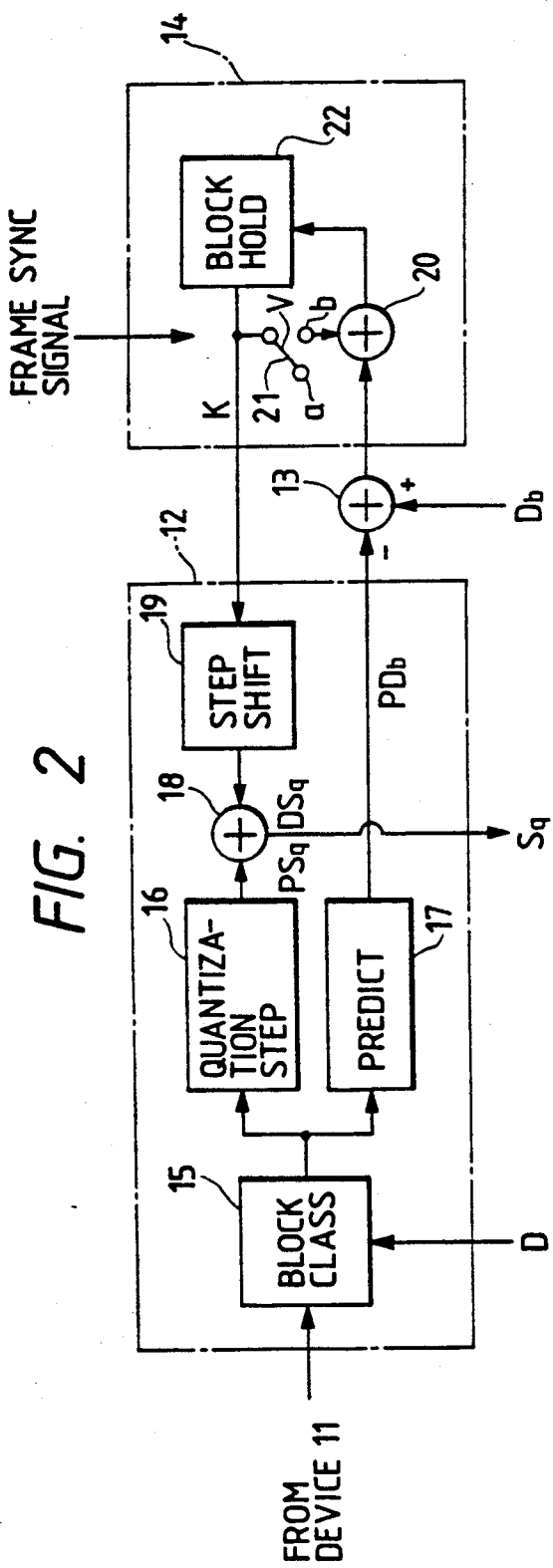
FIG. 2 is a block diagram of the quantization step setting device, the subtracter, and the accumulation adder in the system of FIG. 1.

As shown in FIG. 2, the quantization step setting device 12 includes a block class judgment device 15, a quantization step generator 16, a prediction data amount generator 17, an adder 18, and a quantization step shifter 19.

The block class judgment device 15 receives the threshold value from the threshold value setting device 11. In addition, the block class judgment device 15 receives the delayed normalization information from the fixed-length memory 4. The block class judgment device 15 compares the delayed normalization information and the threshold value for each block and thereby determines a class of the block. For example, the block class judgment device 15 is composed of a comparator.

The quantization step generator 16 generates a primary quantizing step size PSq in accordance with the class determined by the block class judgment device 15. The generated primary quantizing step size PSq is fed to the adder 18. The quantization step generator 16 includes a ROM storing predetermined values of the quantizing step size PSq which are designated by respective addresses. The address fed to the ROM within the quantization step generator 16 are determined in response to the block class fed from the block class judgment device 15 so that one of the predetermined values of the quantizing step size PSq is selected in accordance with the block class.

The prediction data amount generator 17 generates a predicted data amount PDb in accordance with the class determined by the block class judgment device 15. The generated predicted data amount PDb is fed to a subtracter 13. The predicted data amount PDb corresponds to a target data amount. The predicted data amount generator 17 includes a ROM storing predetermined values of the predicted data amount PDb which are designated by respective addresses. The address fed to the ROM within the predicted data amount generator 17 are determined in response to the block class fed from the block class judgment device 15 so that one of the predetermined values of the predicted data amount PDb is selected in accordance with the block class. The predetermination of the values of the predicted data amount PDb is similar to the predetermination of the predicted values of the number of bits per block which are used in the data prediction device 10. Statistically calculated average values are adopted as the values of the predicted data amount PDb.

The entropy encoder 6 generates a signal representing the actual amount Db of code data which is outputted from the entropy encoder 6 during a period corresponding to one block. The actual data amount signal is outputted from the entropy encoder 6 to the subtracter 13. The subtracter 13 generates the data amount difference (error) between the predicted data amount PDb and the actual data amount Db. The data amount error is fed from the subtracter 13 to an adder 20 in an accumulation adder 14.

The accumulation adder 14 includes a block hold circuit 22 which holds an accumulated addition value K. The accumulated addition value K is fed from the block hold circuit 22 to the adder 20 via a movable contact v and a fixed contact b of a switch 21. The adder 20 adds the data amount error and the accumulated addition value K, generating a new accumulated addition value and outputting the new accumulated addition value to the block hold circuit 22. In the block hold circuit 22, the accumulated addition value K is replaced by the new accumulated addition value so that the accumulated value is updated. The accumulated addition value K held by the block hold circuit 22 is reset by disconnecting the movable contact v from the fixed contact b toward a fixed contact a of the switch 21 in response to a signal of a one-frame period such as a frame sync signal. The accumulated addition value K is fed from the block hold circuit 22 to the quantization step shifter 19 of the quantization step setting device 12.

Figure 4:
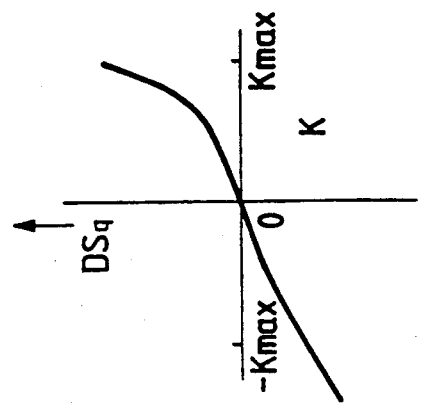
FIG. 4 is a diagram showing the relation between the accumulated addition value and the data value of the shift signal in the system of FIG. 1.

The quantization step shifter 19 converts the accumulated addition value K into a shift signal DSq. The accumulated addition value K and the data value of the shift signal DSq have a predetermined relation such as shown in FIG. 4. For example, the quantization step shifter 19 includes a ROM storing data of the shift signal DSq which have a predetermined relation with the accumulated addition value K. The shift signal DSq is fed from the quantization step shifter 19 to the adder 18. The adder 18 adds the primary quantizing step size PSq and the shift signal DSq, generating a final quantizing step size Sq fed to the adaptive quantizer 5.

As described previously, in the data prediction device 10 of the control section A, the prediction values for the data amount per block are predetermined as a function of the normalization information. The relation between the prediction value for the data amount per block and the normalization information is chosen so as to ensure that the amount of the output code data from the entropy encoder 6 per predetermined period can be maintained at approximately a predetermined constant amount. Statistically calculated average values are adopted as the prediction values for the data amount per block.

The threshold value setting device 11 predicts an amount of data outputted during a predetermined period, such as a one-frame period, on the basis of the predicted data amounts of the respective blocks which are successively fed from the data prediction device 10. In the threshold value setting device 11, threshold values used for the classification of the respective blocks are chosen or determined so that the predicted amount of data outputted during the predetermined period such as the one-frame period can be equal to a preset target amount. Since the quantizing step sizes are determined for the respective classes of the blocks, a variation in the threshold value causes a change in the quantizing step size. Thus, the actual amount of data outputted during the predetermined period such as the one-frame period can be equal to the preset target amount. Specifically, the threshold value setting device 11 sums the predicted data amounts of the respective blocks which are successively fed from the data prediction device 10 during the predetermined period such as the one-frame period, thereby calculating the predicted amount of data outputted during that predetermined (e.g., one-frame) period. A plurality of sets of predetermined threshold values are prepared in the threshold value setting device 10. The actual amount of output data is estimated by use of the predicted amount of data outputted during the predetermined period and each of the sets of the predetermined threshold values. In this way, the estimated values for the actual amount of output data are obtained in correspondence with the respective sets of the predetermined threshold values. The estimated values are compared with a predetermined target value, and one of the estimated values which is equal to the target value, or which is smaller than and closest to the target value, is selected. The set of the threshold values which corresponds to the selected estimated value is outputted from the threshold value setting device 11. These processes are realized by a combination of adders, comparators, and a ROM.

The function of the threshold value setting device 11 corresponds to the following process. The predicted amounts of output codes which are sequentially inputted from the data amount prediction device 10 are added to derive a sum thereof which is generated during a predetermined period such as a one-frame period. The sum of the predicted amounts is compared with a target amount of the output codes which is generated during a predetermined period such as a one-frame period. Threshold values for successive blocks within the predetermined period are determined in accordance with the result of the comparison between the sum of the predicted amounts and the target amount. The determination of the threshold values is designed so as to essentially maintain the actual amount of the output codes at the target amount of the output codes. The determined threshold values are sequentially outputted to the quantization step setting device 12.

In the case of a general video signal, the accumulated value of the predicted data amount PDb is approximately equal to the accumulated value of the actual data amount Db, so that the accumulated addition value K is close to zero. In the case where the actual data amount Db is biased, the accumulated addition value K is clearly negative or positive so that the quantization step shifter 19 generates an appreciable shift signal DSq which can compensate for the bias of the actual data amount Db.

As described previously, the quantization step shifter 19 converts the accumulated addition value K into the shift signal DSq. The characteristics of the conversion of the accumulated addition value K into the shift signal DSq are basically determined in dependence upon the characteristics of encoding, and are designed so that the accumulated addition value K will not exceed a predetermined upper limit Kmax.

As is made clear from the previous description, feedforward control is performed by use of a predicted data amount. A prediction error is obtained as a result of the feedforward control. Feedback control is performed in response to the prediction error. The feedforward control and the feedback control are repeatedly performed at short periods such as periods each corresponding to several blocks. The previously-mentioned control of the data code amount keeps the data amount error less than or equal to the upper limit Kmax at the moment of the end of each one-frame period. It is sufficient that the threshold value determined in the feedforward control section has an allowance of the upper limit Kmax with respect to a target data amount.

In more detail, the orthogonal transform and the entropy encoding enable a high efficiency of encoding. In addition, the normalization and the adaptive quantization cooperate to realize the quantization which well matches to the visual characteristics and also which enables a high efficiency of encoding. The feedforward control determines a primary quantizing step size in accordance with the predicted value of the data amount. The high-speed feedback control shifts the primary quantizing step size to generate a final quantizing step size in response to the difference between the predicted data amount (the target data amount) and the actual data amount. The high-speed feedback control holds the intra-frame accumulation of the prediction error within a level corresponding to several blocks. Therefore, the data amount can be limited to a target amount in unit of a predetermined period such as a one-frame period although the feedforward control has a small allowance with respect to the target data amount. Since the feedback control is performed on the small prediction error, it is possible to prevent the picture quality from changing greatly with the control of the data amount. In addition, since the amount of output data from the entropy encoder 6 is held essentially constant, the capacity of the variable-length buffer 7 can be small.

In the case where the upper limit Kmax of the accumulated addition value is chosen so as to correspond to the data amount of 10 blocks and one frame and one block have 720×480 pixels and 8×8 pixels respectively, the upper limit Kmax of the accumulated addition value approximately equals the data amount of a one-frame period divided by 540 so that a resulting drop in the encoding efficiency can be negligible.

What is claimed is:

1. A system for controlling a number of bits required to represent coded output data, comprising:
   means for encoding input data into codes and outputting said codes;
   means for predicting the number of bits in output codes which are outputted from the encoding means during respective first predetermined periods;
   means for adding the predicted numbers of bits in the output codes to derive a sum thereof which is generated during a second predetermined period longer than said first periods;
   means for controlling an actual number of bits in the output codes from the encoding means in accordance with the derived sum;
   means for sequentially generating differences between the predicted number of bits of the output codes and the actual numbers of bits of the output codes which are generated during respective first periods;
   means for accumulating said differences into an accumulated value; and
   means for controlling the actual numbers of bits of the output codes from the encoding means in accordance with the accumulated value;
   whereby the actual number of bits in the codes which are outputted from the encoding means during each second period can be held equal to or smaller than a predetermined amount.

2. A system for controlling a number of bits required to represent coded output data, comprising:
   means for encoding input data into codes and outputting said codes;
   means for predicting a rate of outputting of the codes from the encoding means;
   means for controlling an actual rate of outputting of the codes from the encoding means in accordance with the predicted rate;
   means for detecting a difference between the actual rate and the target rate of outputting of the codes from the encoding means; and
   means for controlling the actual rate of outputting of the codes from the encoding means in accordance with the detected difference.

* * * * *